United States Patent
Albrecht et al.

(10) Patent No.: US 7,821,336 B2
(45) Date of Patent: Oct. 26, 2010

(54) AMPLIFIER DEVICE

(75) Inventors: Adam Albrecht, Nürnberg (DE); Horst Kroeckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 350 days.

(21) Appl. No.: 11/953,111

(22) Filed: Dec. 10, 2007

(65) Prior Publication Data
US 2008/0143438 A1 Jun. 19, 2008

(30) Foreign Application Priority Data
Dec. 8, 2006 (DE) .................. 10 2006 057 986

(51) Int. Cl.
*H03G 3/00* (2006.01)
*G01V 3/00* (2006.01)
(52) U.S. Cl. ...................... 330/127; 324/322
(58) Field of Classification Search ............... 330/127; 324/318, 322
See application file for complete search history.

(56) References Cited

U.S. PATENT DOCUMENTS

| 3,319,175 | A | | 5/1967 | Dryden |
| 5,565,779 | A | * | 10/1996 | Arakawa et al. ............ 324/318 |
| 6,788,151 | B2 | * | 9/2004 | Shvarts et al. ............... 330/297 |
| 7,457,598 | B2 | * | 11/2008 | Zahm et al. ............... 455/245.1 |
| 7,532,067 | B2 | * | 5/2009 | Albrecht et al. ............. 330/127 |

* cited by examiner

*Primary Examiner*—Louis M Arana
(74) *Attorney, Agent, or Firm*—Schiff Hardin LLP

(57) ABSTRACT

An amplifier device has an amplifier circuit, an energy supply device, a switching matrix and a control device. A radio-frequency, low-energy signal pulse can be amplified into a high-energy power pulse by the amplifier circuit. The amplifier circuit is supplied with electrical energy by the energy supply device. The energy supply device has a number of electrical energy sources that are separated in terms of potential relative to one another in a state in which they are not connected to the amplifier circuit. The electrical energy sources can be selectively connected to the amplifier circuit by the switching matrix. The switching state of the switching matrix can be dynamically set for this purpose by the control device.

15 Claims, 3 Drawing Sheets

1

AMPLIFIER DEVICE

BACKGROUND OF THE INVENTION

1. Field of the Invention

The present invention concerns an amplifier device having an amplifier circuit and an energy supply device. A radio-frequency, low-energy signal pulse can be amplified into a power pulse by the amplifier circuit. The amplifier circuit is supplied with electrical energy by the energy supply device.

2. Description of the Prior Art

Amplifier devices of the above type are generally known. They are in particular used for generation of transmission pulses for RF transmission coils in magnetic resonance systems. Other applications, for example in radar systems, are also possible.

In magnetic resonance systems the requirements for the power pulses to be output vary to a significant extent. This applies both for the duration of an individual pulse and for its maximum power and its average power as well as for the required currents and voltages.

It is of course possible to design the amplifier circuit and the energy supply device such that they operate properly in all operating states even though the energy supply device is permanently connected to the amplifier circuit, and the output voltage emitted by the energy supply device is kept constant, or optimally constant. In practice, however, this approach leads to significant power losses in the amplifier circuit in many operating situations. The power losses are significantly higher than when the amplifier circuit is operated with voltage values that are adapted to the respective operating state of the amplifier circuit.

The adaptation of the voltage value leads to a reduction of the power loss that occurs in the amplifier circuit, but in many cases it leads to significant power losses in the energy supply device. The problem is thus only shifted, but is not solved.

An amplifier device of the aforementioned type, in which the energy source is fashioned as a primary energy source that can be connected to the amplifier circuit via a primary coil and a secondary coil of a transformer, is known from U.S. Pat. No. 3,319,175. The secondary coil has multiple taps so that the voltage that is applied to the amplifier circuit can be adjusted as needed.

SUMMARY OF THE INVENTION

An object of the present invention is to further develop an amplifier device of the aforementioned type such that it can be manufactured and efficiently operated more cost-effectively. The amplifier device should in as a whole exhibit only a relatively small power loss.

The object is achieved by an amplifier device according to the invention, wherein the energy supply device is formed by a number of energy sources that are separated (isolated) in terms of potential relative to one another in a state in which they are not connected to the amplifier circuit. The amplifier device furthermore has a switching matrix by which the electrical energy sources can be connected to the amplifier circuit. The amplifier device has a control device from which a switching state of the switching matrix can be dynamically set.

Based on the inventive solution it is possible to connect the individual energy sources to the amplifier circuit without instabilities, clock couplings or even unwanted surprise effects being able to occur.

The switching matrix is advantageously fashioned and can be controlled by the control device such that at least one of the energy sources can be individually connected to the amplifier circuit. It is thereby possible to connect only one of the energy sources to the amplifier circuit at a specific point in time. Such a connection of a single energy source is particularly useful, when the power pulse to be output exhibits relatively low voltage and/or current requirements.

It is possible for only one of the energy sources to be available for individual connection to the amplifier circuit. Alternatively, it is possible to select which of the energy sources is connected to the amplifier circuit. This latter approach can be particularly useful and sufficient when output voltages of the individual energy sources and/or current carrying capacities of the individual energy sources are different from one another. This procedure can also be useful when redundancy should be ensured.

As an alternative or in addition to the individual connection of one energy source to the amplifier circuit, the switching matrix is advantageously fashioned and can be controlled by the control device such that at least two of the energy sources can be simultaneously connected to the amplifier circuit. The amplifier circuit can thereby be supplied with a higher voltage and/or with a higher current.

When the at least two energy sources exhibit substantially identical current carrying capacities, the switching matrix is advantageously fashioned such that the at least two energy sources can be connected in series to the amplifier circuit. As an alternative or in addition to the substantially identical current carrying capacity together with potential isolation, when the at least two energy sources deliver the same output voltages, the switching matrix is advantageously fashioned and can be controlled by the control device such that the at least two energy sources can be connected in parallel with the amplifier circuit.

Each of the energy sources can advantageously be fed from an alternating voltage network (mains) via the secondary coil device of a transformer device (each energy source having its own, individually associated secondary coil) and a rectifier device downstream of the respective secondary coil device. A potential isolation of the energy sources relative to one another this results in a particularly simple manner by this embodiment.

The transformer device is advantageously fashioned as a multi-phase (in particular three-phase) transformer device. A relatively low ripple of the direct voltage emitted by the energy sources thereby results in a simple manner.

The secondary coil devices advantageously interact with a single primary coil device that can be connected with the alternating voltage network. The design of the transformer device is simplified by this measure.

The transformer device advantageously has at least one further secondary coil device via which at least one further device (that is not an electrical energy source that can be connected to the amplifier circuit) can be fed from the alternating voltage network. By this measure it is possible, for example, to provide a single system transformer that generates all voltages required in a larger system. The further secondary coil device can be in terms of potential from the other secondary coil devices. Alternatively, it can be potential-coupled with one (however advantageously not with more than one) of the other secondary coil devices.

Each energy source advantageously has a basic voltage generation device and a voltage adjuster. In this case the voltage adjuster (voltage setter) is arranged between the respective basic voltage generation device and the switching matrix. The respective voltage adjusters can be controlled by the control device such that it adjusts a respective basic voltage delivered by the respective basic voltage generation device to a respective output voltage. The output voltages can be optimally adjusted by this measure, in particular to predetermined desired voltages.

A desired value of the respective output voltage can be rigidly predetermined. Alternatively, the desired value can be parameterizable or variable.

The switching matrix is formed by switching elements. The switching elements can advantageously be controlled by the control device in a potential-isolated manner. Also, no disadvantageous voltage feedback thus results via control of the switching matrix by the control device.

The switching elements can be fashioned as field effect transistors. In this case the energy sources can be connected to the amplifier circuit in a low-loss and low-resistance manner and be separated in a very high-resistance manner from the amplifier circuit.

In a preferred application of the amplifier device, an RF transmission coil of a magnetic resonance system is arranged downstream of the amplifier circuit such that the high-energy power pulse can be fed to the RF transmission coil as a transmission pulse.

DESCRIPTION OF THE PREFERRED EMBODIMENTS

Figure 1:
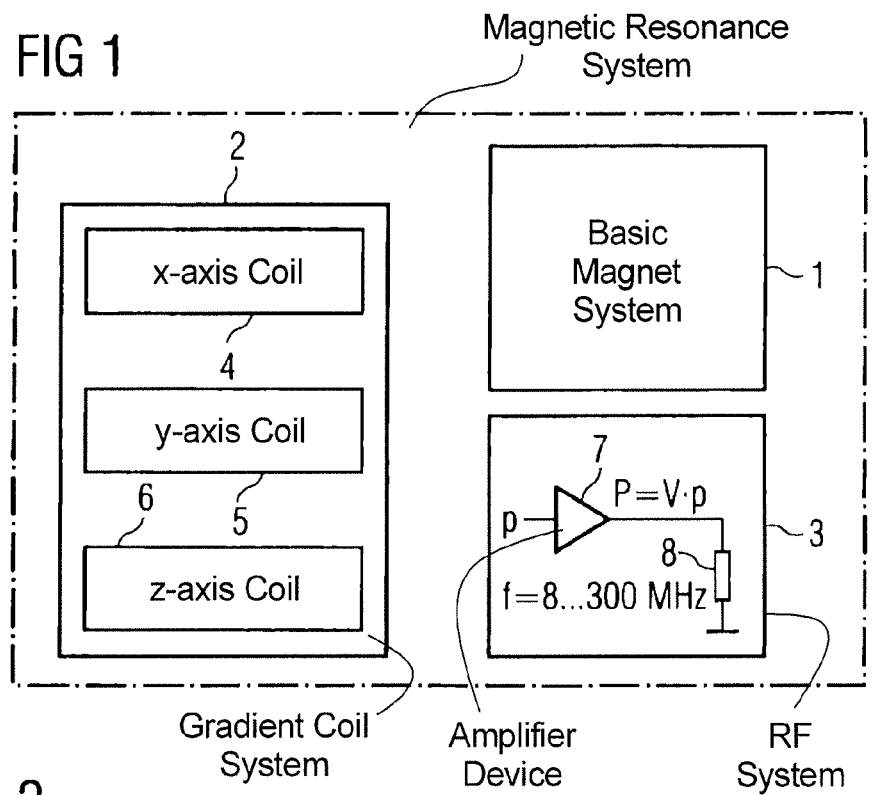
FIG. 1 is a block diagram of a magnetic resonance system.

FIG. 1 shows an imaging magnetic resonance system with various coil systems namely a basic magnet system 1, a gradient magnet system 2 and a radio-frequency system 3. The gradient coil system 2 normally has three sub-systems 4, 5, 6, one for each of the three axes of a Cartesian coordinate system. The basic coil system 1 and the gradient magnet system 2 are of subordinate importance in the framework of the present invention and need not be explained in detail.

In the course of acquisition of a raw data sequence of the magnetic resonance system, a low-energy pulse (signal pulse) p is fed to an amplifier device 7 of the radio-frequency system 3 at specific points in time. Each low-energy pulse p exhibits a predetermined time curve that can be different from pulse p to pulse p. A longer pulse pause lies between every two low-energy pulses p. The amplifier device 7 amplifies the low-energy pulse p fed to it and thus generates a corresponding power pulse P. The amplifier device 7 feeds the power pulse P to an RF transmission coil 8 of the radio-frequency system 3 as a transmission pulse. The embodiment of the amplifier device 7 is the main subject of the present invention. This is subsequently explained in detail in connection with FIGS. 2 through 5.

Figure 2:
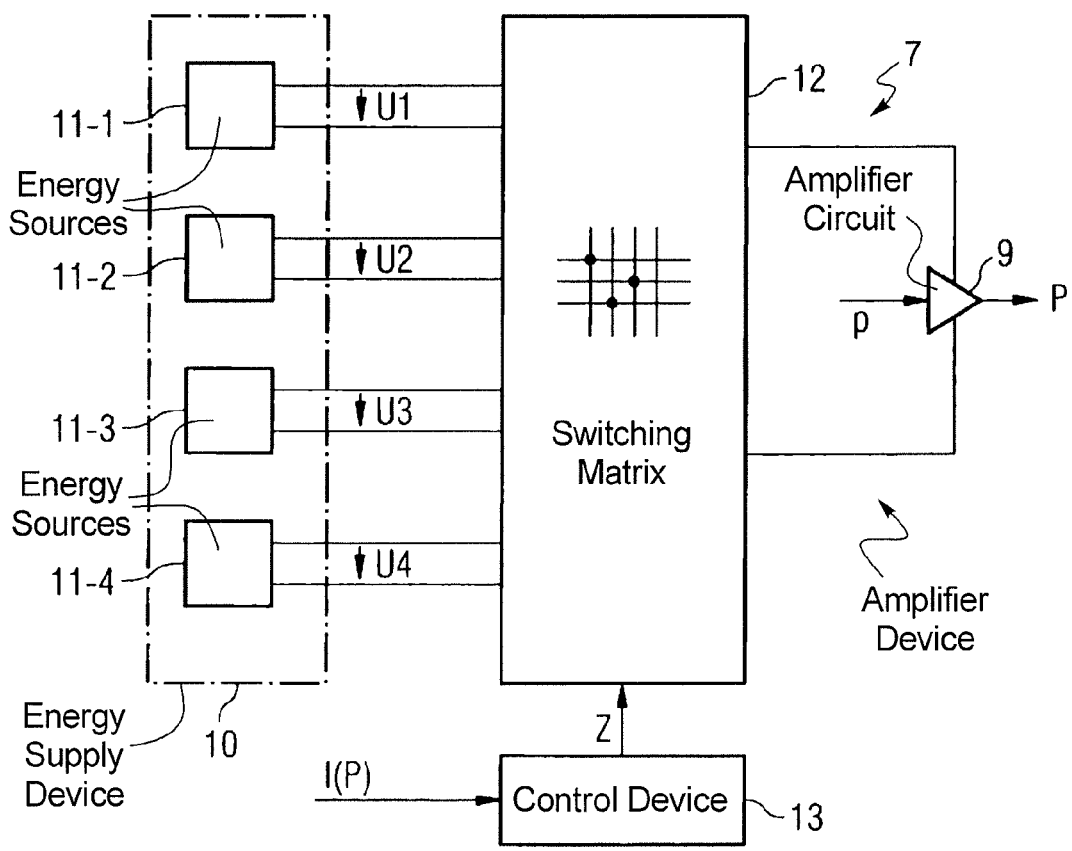
FIG. 2 is a block diagram of an inventive amplifier device.

According to FIG. 2, the amplifier device 7 has an amplifier circuit 9. The signal pulse p can be amplified into the power pulse P by the amplifier circuit 9. The power pulse P corresponds with the signal pulse p, meaning that it corresponds to the signal pulse p except for an amplifier factor V with which the signal pulse p has been amplified.

The signal pulse p in the is radio-frequency range. It normally exhibits a frequency f that lies between 8 and 300 MHz. Sometimes the frequency f can be even higher.

The amplifier device 7 furthermore comprises an energy supply device 10. The amplifier circuit 9 can be supplied with electrical energy by means of the energy supply device 10. The energy supply device 10 has a number of electrical energy sources 11-1 through 11-4.

A switching matrix 12 is arranged between the energy supply device 10 and the amplifier circuit 9. The switching matrix 12 is likewise a component of the amplifier device 7. The electrical energy sources 11-1 through 11-4 can be connected to the amplifier circuit 9 by means of the switching matrix 12.

The amplifier device 7 furthermore has a control device 13. A switching state Z of the switching matrix 12 can be dynamically adjusted by the control device 13. The control device 13 allows selection of which of the energy sources 11-1 through 11-4 are connected to the amplifier circuit 9, and adjustment of the energy source or sources that are connected.

Information I about the next power pulse P to be output is normally fed to the control device 13. Using the information I the control device 13 then determines the switching state Z and correspondingly controls the switching matrix 12. As an alternative or in addition to the determination of the switching state Z using the information I, the control device 13 can determine the switching state Z dependent on output voltages U1 through U4 which the energy sources 11-1 through 11-4 currently exhibit.

The switching state Z is normally set before the output of the respective power pulse P and maintained during the output of the power pulse P. It is alternatively possible to change the switching state Z during the output of the power pulse P.

The switching state Z can be varied. For example, it is possible that the control device 13 connects a single one of the energy sources 11-1 through 11-4 or multiple energy sources 11-1 through 11-4 to the amplifier circuit 9. In this case the control device 13 also determines which of the energy sources 11-1 through 11-4 are connected to the amplifier circuit 9 and in which connection (parallel, in series, combined) this possibly ensues. This is discussed again later in connection with FIG. 4.

Figure 3:
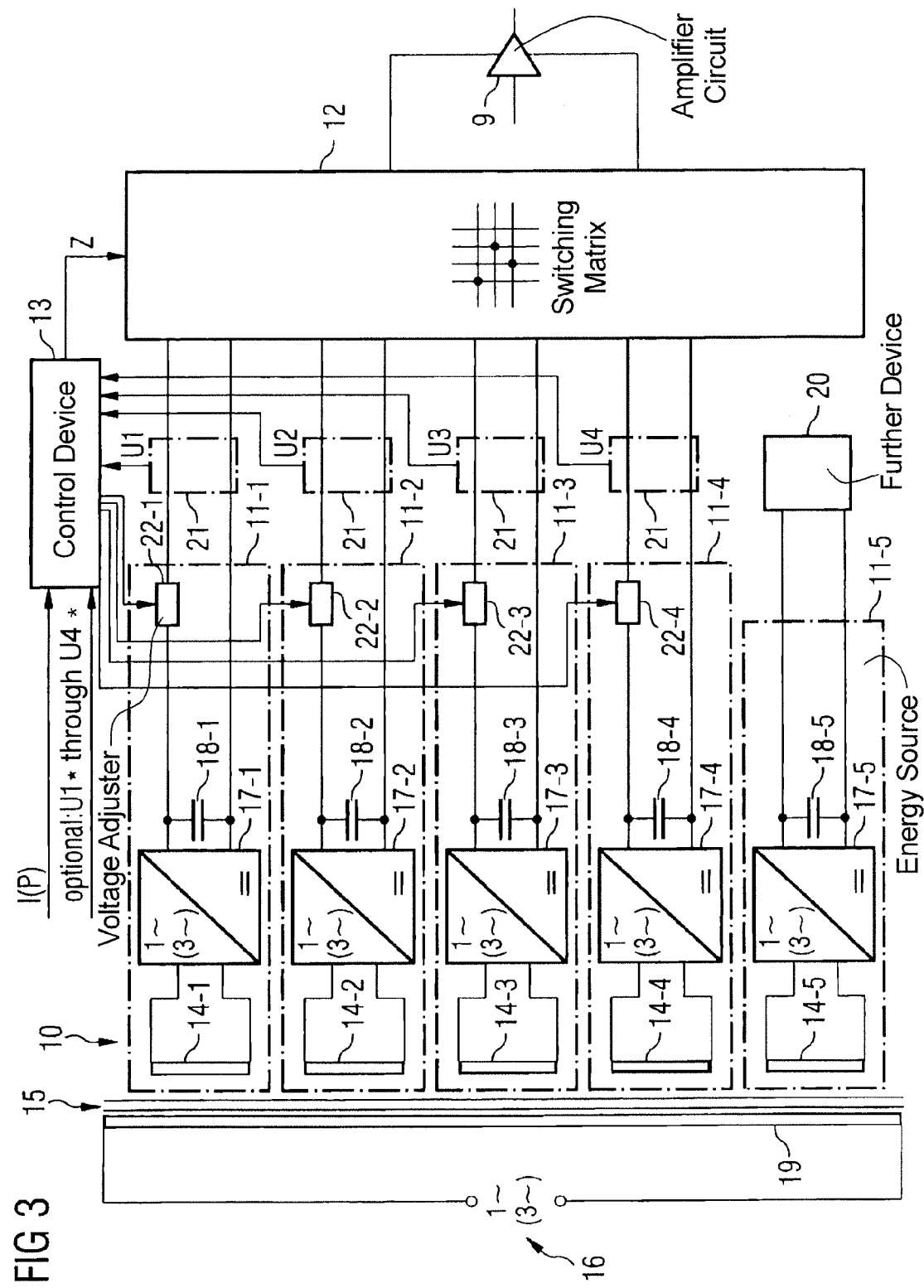
FIG. 3 shows an exemplary embodiment of the amplifier device of FIG. 2.

FIG. 3 shows a possible embodiment of the amplifier device 7 from FIG. 2. In this embodiment a possible design of the energy supply device 10 is shown in detail.

According to FIG. 3, the energy sources 11-1 through 11-4 are potential-separated relative to one another. The potential separation can be realized, for example, by each of the energy sources 11-1 through 11-4 being fed from an alternating voltage network 16 via a secondary coil device 14-1 through 14-4 of a transformer device 15, the secondary coil device 14-1 through 14-4 being individually associated with the respective energy sources 11-1 through 11-4. Rectifier devices 17-1 through 17-4 are arranged downstream of the respective secondary coil device 14-1 through 14-4.

In the simplest case, the secondary coil devices 14-1 through 14-4 are fashioned single-phase. In this case a single secondary coil is present per secondary coil device 14-1 through 14-4. In the simplest case the rectifier devices 17-1 through 17-4 are fashioned as simple half-wave rectifiers that comprise a single diode. Although this embodiment is possible, it is not preferred.

At least the rectifier devices 17-1 through 17-4 are advantageously fashioned as bridge rectifiers. Furthermore, the transformer device 15 is advantageously fashioned as a multi-phase transformer device 15. The design as a three-phase transformer device 15 (rotary current transformer) is in particular possible. In the event that the transformer device 15 is a multi-phase transformer device 15, the direct output signal of the rectifier devices 17-1 through 17-4 already exhibits a significantly reduced ripple. The ripple can possibly be even further reduced by capacitors 18-1 through 18-4 that are arranged downstream of the rectifier devices 17-1 through 17-4.

According to FIG. 3, the secondary coil devices 14-1 through 14-4 interact with a single primary coil device 19 of the transformer device 15. The primary coil device 19 is connected with the alternating voltage network 16. The primary coil device 19 is normally fashioned analogous to the secondary coil devices 14-1 through 14-4. The primary coil device 19 normally has the same phase number as the secondary coil devices 14-1 through 14-4.

The interaction of the secondary coil devices 14-1 through 14-4 with a single common primary coil device 19 is preferable but not mandatory. Alternatively, the secondary coil devices 14-1 through 14-4 could interact individually or in groups with a separate, respective primary coil device 19.

According to FIG. 3, the transformer device 15 comprises at least one further secondary coil device 14-5. A further device 20 can be fed from the alternating voltage network 16 via the further secondary coil device 14-5. The further device 20 is not an electrical energy source that can be connected to the amplifier circuit 9, but rather serves (in principle any) other purposes. The further secondary coil device 14-5 can exhibit the same phase number as the primary coil device 19 or a lower phase number.

Each energy source 11-1 through 11-5 has a basic voltage generation device. In the embodiment according to FIG. 3, for example, one of the respective secondary coil devices 14-1 through 14-5 including the downstream rectifier devices 17-1 through 17-5 together with support capacitors 18-1 through 18-5 respectively form such a basic voltage generation device. The voltages delivered by the basic voltage generation devices are normally not adjustable. By contrast, the output voltages U1 through U4 delivered by the energy sources 11-1 through 11-4 should normally be constant and exhibit a predetermined desired value U1* through U4*. The control device 13 can definitely predetermine the desired values U1* through U4*. Alternatively, they can be parameterizable or variable (see FIG. 3).

The output voltages U1 through U4 are detected by corresponding measurement devices 21 and fed to the control device 13. The control device 13 controls voltage adjusters 22-1 through 22-4 that are arranged between the respective basic voltage generation device and the switching matrix 12. Based on the control by the control device 13, the voltage adjusters 22-1 through 22-4 adjust the basic voltage to the respective output voltage U1 through U4.

Figure 4:
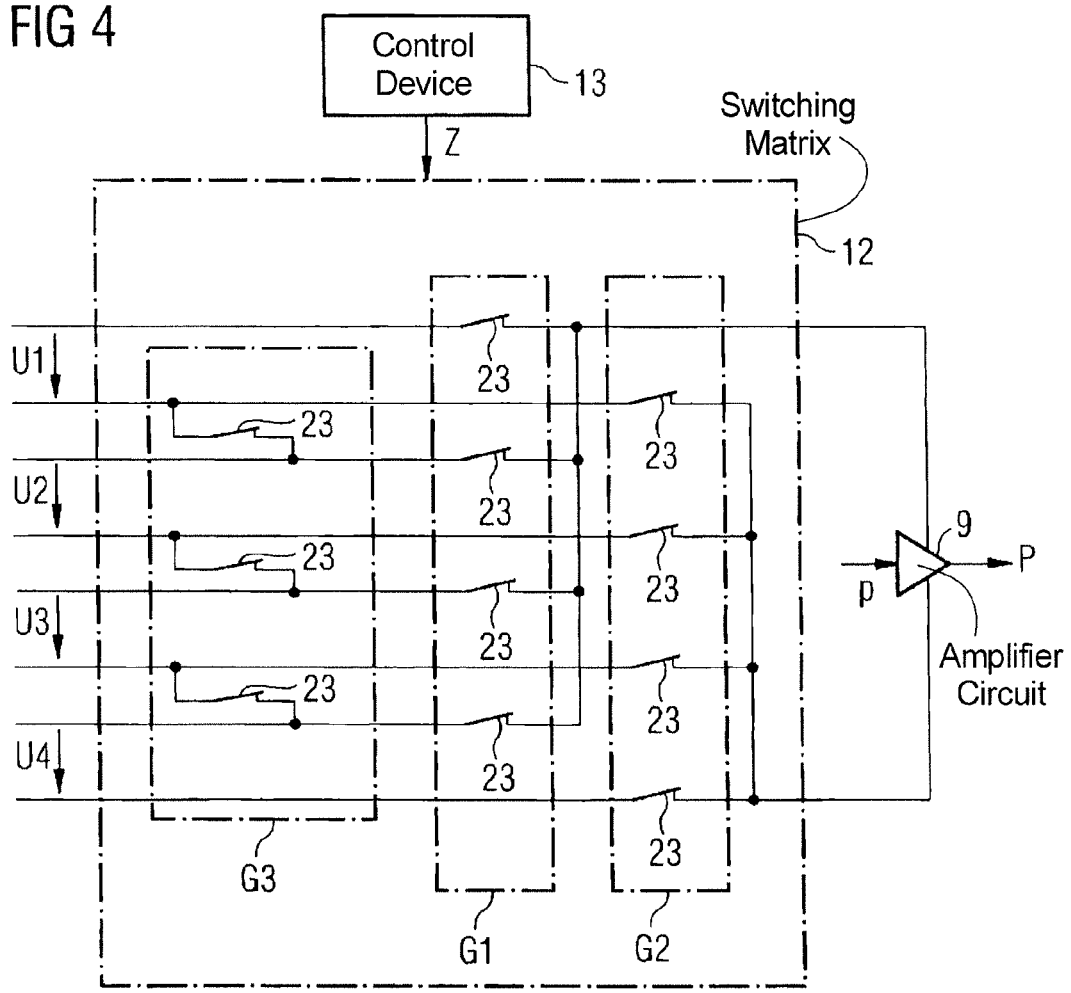
FIG. 4 shows an exemplary embodiment of a switching matrix.
Figure 5:
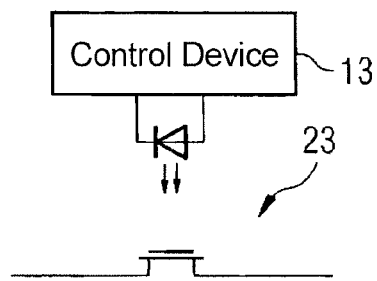
FIG. 5 shows an exemplary embodiment of a switching element.

FIG. 4 shows a possible embodiment of the switching matrix 12. The embodiment of the switching matrix 12 (corresponding to FIG. 4) can be realized independent of the embodiment of the energy sources 11-1 through 11-4 (corresponding to FIG. 3). It is in particular possible to realize the embodiments of FIG. 3 and FIG. 4 separately from one another or combined with one another.

The embodiment from FIG. 4 is not mandatory. More complex or simpler embodiments of the switching matrix 12 can be alternatively realized.

According to FIG. 4, the switching matrix 12 has first, second and third groups G1 through G3 of switching elements 23. Each switching element 23 can be controlled by the control device 13, in principle independent of all other switching elements 23. For example, the following switching states Z can be set by the control device 13:

The control device 13 controls one of the switching elements 23 of the first group G1 and the corresponding switching element 23 of the second group G2 such that precisely one of the energy sources 11-1 through 11-4 (for example the energy source 11-2) is singularly connected to the amplifier circuit 9. The term "singularly" hereby means that only a single one of the energy sources 11-1 through 11-4 is connected to the amplifier circuit 9 at a point in time. Depending on which two switching elements 23 (one each of the first and second groups G1, G2) are connected, each of the energy sources 11-1 through 11-4 can be singularly connected to the amplifier circuit 9. However, other embodiments are alternatively possible.

The control device 13 controls two (or more) of the switching elements 23 of the first group G1 and the corresponding switching element 23 of the second group G2 such that two (or more) of the energy sources 11-1 through 11-4 are connected simultaneously and in parallel to the amplifier circuit 9. In this case the energy sources 11-1 through 11-4 connected simultaneously and in parallel to the amplifier circuit 9 should deliver identical output voltages U1 through U4.

The control device 13 controls (at least) one of the switching elements 23 of the third group G3 as well as one of the switching elements 23 from each of the first and second groups G1, G2, such that two (or more) of the energy sources 11-1 through 11-4 are connected simultaneously and in series with the amplifier circuit 9. In this case the energy sources 11-1 through 11-4 connected in series should exhibit (at least essentially) identical current carrying capacities. Furthermore, those of the energy sources 11-1 through 11-4 that are connected in series with the amplifier circuit 9 must be potential-free relative to one another as long as they are separated from the amplifier circuit 9, thus are not connected to the amplifier circuit 9.

Combinations of the described procedures are also possible. For example, a series circuit of the energy sources 11-1 and 11-2 on the one hand and of the energy sources 11-3 and 11-4 on the other side can thus be formed by controlling two switching elements 23 of the third group G3. The two series circuits of two energy sources 11-1 through 11-4 per series circuit can be connected in parallel with the amplifier circuit 9 by controlling two switching elements 23 per each of the first and second groups G1, G2.

The circumstance that the switching elements 23 can be controlled by the control device 13 should not detract from the existing potential freedom of the energy sources 11-1 through 11-4. For this reason the switching elements 23 can advantageously be controlled in a potential-separated manner by the control device 13. For example, the switching elements 23 according to FIG. 5 can be realized as optocouplers. Other potential-separated embodiments (for example as transformers or the like) are also possible and conceivable.

The throughput resistance from the energy sources 11-1 through 11-4 to the amplifier circuit 9 or, respectively, the energy sources 11-1 through 11-4 among one another should be very small or very large depending on whether the respective switching element 23 is connected through. Furthermore, the control should be able to occur with as little power loss as possible. The switching elements 23 are therefore advantageously fashioned as field effect transistors according to FIG. 5. They can possibly be fashioned of the type known as photo-MOS relays in connection with the potential-separated control.

The present invention was explained in the preceding in connection with four energy sources 11-1 through 11-4, but the number of energy sources 11-1 through 11-4 can clearly be arbitrarily selected when it is at least two. For example, 3, 5, 6, 8, 10, 15, 20, . . . energy sources 11-1 through 11-4 can be present.

The inventive amplifier device 7 can in particular be operated independently of the number of energy sources 11-1 through 11-4 that are connected to the amplifier circuit 9, and independently of which type of connection (parallel, in series, combined). The stability of the operation is also ensured independently of the form and (within limits) the power requirement of the power pulses P.

Although modifications and changes may be suggested by those skilled in the art, it is the intention of the inventors to embody within the patent warranted hereon all changes and modifications as reasonably and properly come within the scope of their contribution to the art.

We claim as our invention:

1. An amplifier device comprising:
   an amplifier circuit having an input configured to receive a radio-frequency, low-energy signal pulse, which is amplified by said amplifier circuit into a high-energy power pulse at an output of the amplifier circuit;
   an energy supply device that supplies said amplifier circuit with electrical energy, said energy supply device comprising a plurality of electrical energy sources;
   a switching matrix connected between the energy sources of said energy supply device and said amplifier circuit;
   a control device connected to said switching matrix that operates said switching matrix to selectively connect one or more of said energy sources to said amplifier circuit; and
   said energy sources in said energy supply device being separated in terms of voltage from each other in a state in which the energy sources are not connected to the amplifier circuit.

2. An amplifier device as claimed in claim 1 wherein said control device operates said switching matrix to selectively connect only one of said energy sources at a time to said amplifier circuit.

3. An amplifier device as claimed in claim 2 wherein said control device operates said switching matrix to simultaneously connect at least two of said energy sources to the amplifier circuit.

4. An amplifier device as claimed in claim 3 wherein each of said at least two energy sources has a current carrying capacity, with the respective current carrying capacities of said at least two energy sources being substantially equal, and wherein said control circuit operates said switching matrix to connect said at least two energy sources in series to said amplifier circuit.

5. An amplifier device as claimed in claim 3 wherein each of said at least two energy sources delivers an output voltage, with the respective output voltages of said at least two energy sources being substantially equal, and wherein said control device operates said switching matrix to connect said at least two energy sources in parallel with said amplifier circuit.

6. An amplifier device as claimed in claim 1 comprising a transformer device having a primary coil arrangement, configured for connection to an alternating voltage network, and a secondary coil arrangement, said secondary coil arrangement comprising a plurality of individual secondary coils, each of said energy source having one of said secondary coils connected thereto and uniquely associated therewith to feed alternating voltage from said alternating network to that energy source, and said amplifier device comprising a plurality of rectifier devices respectively connected downstream of the respective secondary coils.

7. An amplifier device as claimed in claim 6 wherein said transformer device is a multi-phase transformer device.

8. An amplifier device as claimed in claim 6 wherein said primary coil arrangement is a single primary coil connectable with said alternating voltage network.

9. An amplifier device as claimed in claim 8 wherein said amplifier device comprises at least one further secondary coil configured to interact with a further device, that is not one of said energy sources, to feed said further device with alternating voltage from said alternating voltage network.

10. An amplifier device as claimed in claim 1 wherein each of said energy sources comprises a voltage generator and a voltage adjuster, the voltage adjuster being connected between the voltage generating device and the switching matrix, and each voltage adjuster being individually controlled by said control device to adjust a voltage delivered by the voltage generator to a selected output voltage.

11. An amplifier device as claimed in claim 10 wherein said control device adjusts said voltage delivered by said voltage generator to a fixed, predetermined voltage as said selected output voltage.

12. An amplifier device as claimed in claim 10 wherein said control circuit adjusts said voltage delivered by said voltage generator to a selected output voltage that is parameterizable or variable.

13. An amplifier device as claimed in claim 1 wherein said switching matrix comprises a plurality of switching elements controlled by said control device in a potential-separated manner.

14. An amplifier device as claimed in claim 13 wherein each of said switching elements is a field effect transistor.

15. An amplifier device as claimed in claim 1 comprising a radio-frequency transmission coil of a magnetic resonance system connected downstream of said output of said amplifier circuit, with said amplifier circuit feeding said high-energy power pulse to said RF transmission coil as a transmission pulse.

\* \* \* \* \*